(12) United States Patent
Sakai

(10) Patent No.: US 9,025,793 B2
(45) Date of Patent: May 5, 2015

(54) AUDIO SIGNAL PROCESSING CIRCUIT

(75) Inventor: Mitsuteru Sakai, Kyoto (JP)

(73) Assignee: Rohm Co., Ltd. (JP)

( * ) Notice: Subject to any disclaimer, the term of this patent is extended or adjusted under 35 U.S.C. 154(b) by 317 days.

(21) Appl. No.: 13/528,079

(22) Filed: Jun. 20, 2012

(65) Prior Publication Data

US 2012/0328126 A1      Dec. 27, 2012

(30) Foreign Application Priority Data

Jun. 21, 2011   (JP) .................................. 2011-137571
Jun. 21, 2011   (JP) .................................. 2011-137572

(51) Int. Cl.
  *H03G 3/00*      (2006.01)
  *H03G 3/30*      (2006.01)

(52) U.S. Cl.
  CPC .................................. *H03G 3/3005* (2013.01)

(58) Field of Classification Search
  CPC ... H03G 1/0088; H03G 3/001; H03G 3/3005; H03G 3/3015; H03G 3/3021; H03G 3/3026; H03G 3/3094; H03G 3/32; H03G 3/34; H03G 3/341; H03G 7/00; H03G 7/001; H03G 7/002; H03G 7/004; H03G 7/005; H03G 7/06; H03G 9/00; H03G 9/005; H03G 9/02; H03G 9/025; H03G 9/14; H03G 9/18; H03G 9/30; H03G 11/00; H03G 11/002; H03G 11/006; H03G 11/008; H03G 11/08; H03G 2201/706; H04R 5/04; H04R 27/02; H04R 2430/01
  USPC ............ 381/28, 61, 84, 85, 80, 81, 94.5, 102, 381/103, 104, 106, 107, 108, 109, 120, 121, 381/123; 330/278, 279, 280, 281, 282, 284, 330/294, 302, 307; 455/127.2, 127.3, 455/194.1, 194.2, 232.1, 233.1, 234.1, 455/234.2, 252.1, 253.2, 341; 379/390.01, 379/390.03, 395
  See application file for complete search history.

(56) References Cited

U.S. PATENT DOCUMENTS 3,613,011 A * 10/1971 Wood ............................. 455/267
4,479,237 A * 10/1984 Sugasawa ........................ 381/57
5,046,107 A *  9/1991 Iwamatsu ...................... 381/107

FOREIGN PATENT DOCUMENTS

JP      60080311 A  *  5/1985
JP       9-205482 A     8/1997
JP     2000-151309 A    5/2000
JP     2007-325057 A   12/2007

* cited by examiner

*Primary Examiner* — Leshui Zhang
(74) *Attorney, Agent, or Firm* — Cantor Colburn LLP

(57) ABSTRACT

A selector selects an analog audio signal input to one input port from among analog audio signals input to multiple input ports according to an instruction from the user. An analog gain control circuit amplifies the analog audio signal received from the selector, with a corresponding one of the gains set for the respective input ports. An analog gain control circuit is configured to gradually change its gain when the gain is switched. An A/D converter converts an output signal of the analog gain control circuit into a digital audio signal. A first audio signal processing circuit is monolithically integrated on a signal semiconductor substrate.

16 Claims, 7 Drawing Sheets

AUDIO SIGNAL PROCESSING CIRCUIT

BACKGROUND OF THE INVENTION

1. Field of the Invention

The present invention relates to an audio signal processing technique.

2. Description of the Related Art

In some cases, with an audio apparatus, after an analog audio signal is temporarily converted into a digital audio signal by means of an A/D converter, the digital signal thus converted is subjected to volume adjustment or frequency characteristics modulation (equalizing) by means of digital signal processing, and the digital signal thus processed is again converted into an analog audio signal by means of a D/A converter.

FIG. 1 is a block diagram which shows a configuration of an audio apparatus investigated by the present inventor. An audio apparatus 1r includes a sound source 2, an electroacoustic conversion element such as a speaker or a headphone (which will collectively be referred to simply as the "speaker" hereafter) 4, a first audio signal processing circuit 200r, and a second audio signal processing circuit 100.

The sound source 2 is configured to output an audio signal S1. The sound source 2 is configured as a CD player, a DVD player, or a silicon audio player, having an analog output, for example. The first audio signal processing circuit 200r includes multiple input ports $Pi_1$ through $Pi_3$, each of which allows the audio signal S1 to be received from the sound source 2.

A selector 50 is configured to select the audio signal input to an input port selected by the user from among the input ports Pi. The A/D converter 54 is configured to convert the analog audio signal S2 received from the selector 50 into a digital audio signal S3.

The amplitude, i.e., the volume, of the input audio signal input to each input port, changes depending on the respective sound sources. Thus, a digital gain control circuit 70 is configured to multiply the digital audio signal S3 input to each input port by a gain (coefficient) set for the input port, in order to equalize the volume for each sound source. A second audio signal processing circuit 100, which is configured as a downstream circuit, is configured to perform various kinds of digital processing on the digital audio signal S4, and to convert the digital audio signal thus processed into an analog audio signal S5. The analog audio signal S5 is input to the speaker 4, which is downstream of the second audio signal processing circuit 100, via unshown amplifiers or filters.

RELATED ART DOCUMENTS

Patent Documents

[Patent Document 1]
Japanese Patent Application Laid Open No. 2000-151309
[Patent Document 2]
Japanese Patent Application Laid Open No. H09-205482
[Patent Document 3]
Japanese Patent Application Laid Open No. 2007-325057

As described above, the analog audio signal S1 has a level that changes depending on the sound source 2. In a case in which the audio signal S1 has a low level, such an audio signal is converted into a digital audio signal using only a small part of the input voltage range of the A/D converter 54. This leads to a problem in that such a digital audio signal has a poor S/N ratio.

SUMMARY OF THE INVENTION

The present invention has been made in order to solve such a problem. Accordingly, it is an exemplary purpose of an embodiment of the present invention to provide an audio apparatus having an improved S/N ratio.

1. An embodiment of the present invention relates to an audio signal processing circuit. The audio signal processing circuit comprises: a selector configured to select an analog audio signal input to one input port selected by the user from among analog audio signals input to multiple input ports; an analog gain control circuit configured to amplify the analog audio signal received from the selector with a gain set for each input port, and to gradually change the gain when the gain is switched; and an A/D converter configured to convert an output signal of the analog gain converter into a digital audio signal. The aforementioned components are monolithically integrated on a single semiconductor substrate. The analog gain control circuit and the A/D converter are configured to operate according to respective clock signals having an integer-multiple relation with a common master clock signal as a base clock signal.

In recent years, as the power consumption of a sound source connected to each input port has become lower, in many cases, the amplitude of the analog audio signal input to each input port becomes smaller. By providing the analog gain control circuit having a so-called soft transition switching function as an upstream stage of the A/D converter, and by integrating these components, such an embodiment is capable of providing the A/D converter with an analog audio signal having an optimum signal level for the input range of the A/D converter. Thus, such an arrangement allows the A/D converter to exhibit its maximum performance, thereby providing an improved S/N ratio.

Furthermore, by configuring the analog gain control circuit and the A/D converter as built-in components of a single IC (Integrated Circuit), and by operating the analog gain control circuit and the A/D converter in synchronization with the respective clock signals generated based on the same master clock signal, such an embodiment is capable of reducing beat noise that occurs when the analog gain control circuit and the A/D converter are in an asynchronous state.

Examples of such a "monolithically integrated" arrangement include: an arrangement in which all the circuit components are formed on a semiconductor substrate; and an arrangement in which principal circuit components are monolithically integrated. Also, a part of circuit components such as resistors and capacitors may be arranged in the form of components external to such a semiconductor substrate in order to adjust the circuit constants. The term "amplification" includes amplification with a gain that is smaller than 1, i.e., "attenuation", in addition to amplification with a gain that is greater than 1.

Also, when the digital audio signal has a level that is lower than a predetermined threshold, the gain of the analog gain control circuit may be set to a minimum value.

Thus, such an arrangement provides a dramatically improved S/N ratio in the no-input state or the no-signal state.

Also, before a switching operation of the selector, the gain of the analog gain control circuit may be set to a minimum value. Also, after the switching operation of the selector is completed, the gain of the analog gain control circuit may be set to a value that corresponds to the selected input port.

Thus, such an arrangement suppresses noise occurring in the switching operation of the selector.

Also, when the level of the digital audio signal is clipped, the gain of the analog gain control circuit may be reduced.

By implementing such a function, such an arrangement allows the gain to be raised beforehand for each input port. Thus, such an arrangement allows the audio signal having a greater amplitude to be input to the A/D converter configured as a downstream circuit even if the input analog audio signal has only a small amplitude. As a result, such an arrangement provides an improved S/N ratio when the audio signal is played back.

Also, a frequency component included in the digital audio signal may be detected. Also, a transition time of the gain of the analog gain control circuit may be reduced as a frequency component included in the digital audio signal becomes higher.

If the gain is changed in a short period of time when the audio signal has a low-frequency component as a dominant component, such an arrangement leads to the occurrence of audible noise. Conversely, when the audio signal has a high-frequency component as a dominant component, such an arrangement rarely leads to the occurrence of audible noise even if the gain is changed in a short period of time. Such an embodiment is capable of optimizing the transition time of the gain according to the frequency component of the audio signal.

Also, a transition time of the gain of the analog gain control circuit may be reduced as an amplitude of the digital audio signal becomes lower.

If the gain is changed in a short period of time when the audio signal has a large amplitude, such an arrangement leads to the occurrence of audible noise. Conversely, when the audio signal has a small amplitude, such an arrangement rarely leads to the occurrence of audible noise even if the gain is changed in a short period of time. Such an embodiment is capable of optimizing the transition time of the gain according to the amplitude of the audio signal.

Another embodiment of the present invention relates to an audio apparatus. The audio apparatus comprises an audio signal processing circuit according to any one of the aforementioned embodiments.

2. Yet another embodiment of the present invention also relates to an audio signal processing circuit. The audio signal processing circuit comprises: a D/A converter configured to convert the input digital audio signal into an analog audio signal; and an analog volume circuit configured to amplify an output signal of the D/A converter with a gain that corresponds to a volume value set by a user, and to gradually change the gain when the volume value is switched. The aforementioned components are monolithically integrated on a single semiconductor substrate. The D/A converter and the analog volume circuit are configured to operate according to respective clock signals having an integer-multiple relation with a common master clock signal as a base clock signal.

With such an embodiment, by providing an analog volume circuit having a so-called soft transition switching function as a downstream stage of the D/A converter, and by integrating these components, such an such an arrangement provides improved distortion characteristics when the input signal has a low level, as compared with an arrangement in which a digital volume circuit is provided as an upstream stage of the D/A converter.

Furthermore, by configuring the D/A converter and the analog volume circuit as built-in components of a single IC (Integrated Circuit), and by operating the D/A converter and the analog volume circuit in synchronization with the respective clock signals generated based on the same master clock signal, such an embodiment is capable of reducing beat noise that occurs when the D/A converter and the analog volume circuit are in an asynchronous state.

Examples of such a "monolithically integrated" arrangement include: an arrangement in which all the circuit components are formed on a semiconductor substrate; and an arrangement in which principal circuit components are monolithically integrated. Also, a part of circuit components such as resistors and capacitors may be arranged in the form of components external to such a semiconductor substrate in order to adjust the circuit constants. The term "amplification" includes amplification with a gain that is smaller than 1, i.e., "attenuation", in addition to amplification with a gain that is greater than 1.

Also, when the digital audio signal has a level that is lower than a predetermined threshold value, the gain of the analog volume circuit may be set to a minimum value.

Thus, such an arrangement provides a dramatically improved S/N ratio in the no-input state or no-signal state.

Also, the digital audio signal may require a predetermined delay time to reach the analog volume circuit after it is input to the audio signal processing circuit. Also, when the level of the digital audio signal transits from a level that is lower than a predetermined threshold value to a level that is higher than a predetermined threshold value, the analog volume circuit may be configured to change the gain of the analog volume circuit from the minimum value to a value that corresponds to a volume value set by the user in a transition time that is shorter than the delay time.

Thus, when the state transits from the no-input state or no-signal state to the signal output state, such an arrangement allows the volume control to be completed before the audio signal reaches the analog volume circuit. Thus, such an arrangement is capable of preventing the volume from changing while the audio signal is being played back.

Also, the analog volume circuit may be configured to detect a frequency component included in the digital audio signal. Also, the analog volume circuit may be configured to shorten a transition time of the gain as a frequency component included in the digital audio signal becomes higher.

If the volume is changed in a short period of time when the audio signal has a low-frequency component as a dominant component, such an arrangement leads to the occurrence of audible noise. Conversely, when the audio signal has a high-frequency component as a dominant component, such an arrangement rarely leads to the occurrence of audible noise even if the volume is changed in a short period of time. Such an embodiment is capable of optimizing the transition time of the volume according to the frequency component of the audio signal.

Also, the analog volume circuit may be configured to shorten a transition time of the gain as the amplitude of the digital audio signal becomes lower.

If the volume is changed in a short period of time when the audio signal has a large amplitude, such an arrangement leads to the occurrence of audible noise. Conversely, when the audio signal has a small amplitude, such an arrangement rarely leads to the occurrence of audible noise even if the volume is changed in a short period of time. Such an embodiment is capable of optimizing the transition time of the volume according to the amplitude of the audio signal.

Yet another embodiment of the present invention relates to an audio apparatus. The audio apparatus comprises an audio signal processing circuit according to any one of the aforementioned embodiments.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

[First Embodiment]

Figure 1:
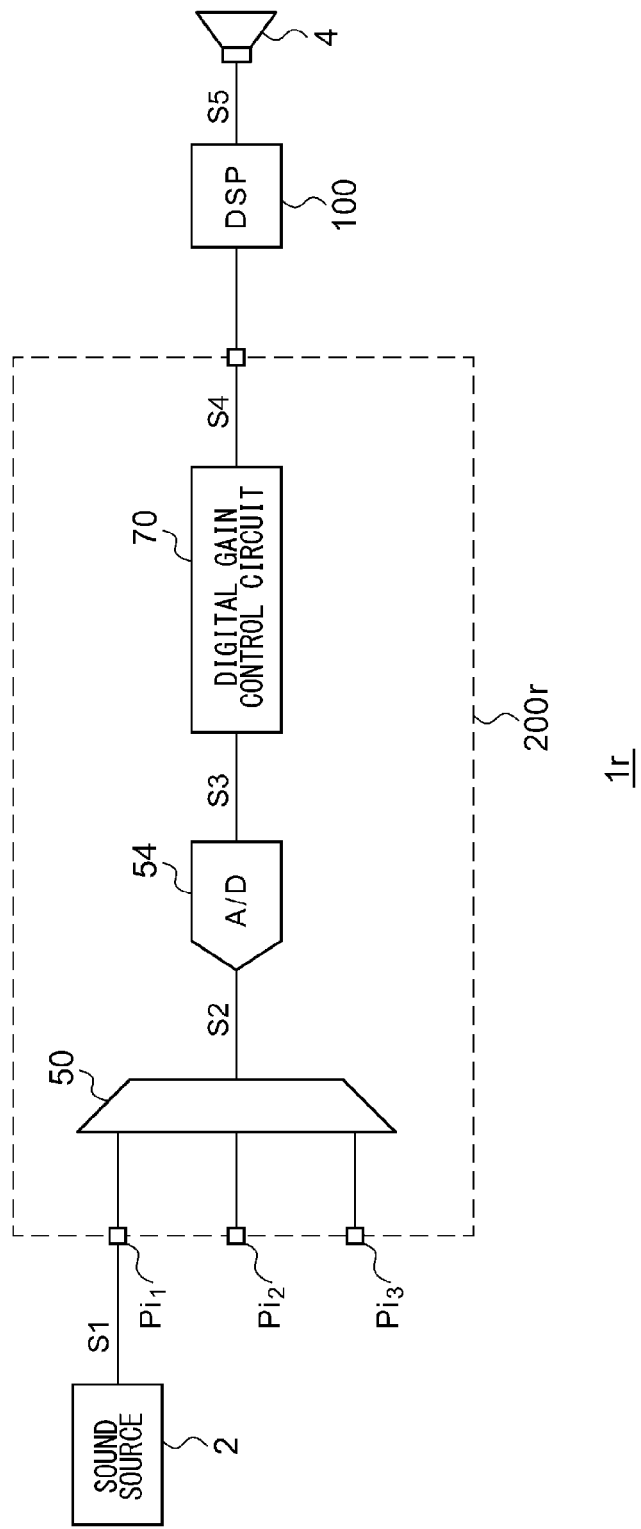
FIG. 1 is a block diagram which shows a configuration of an audio apparatus investigated by the present inventor.
Figure 2:
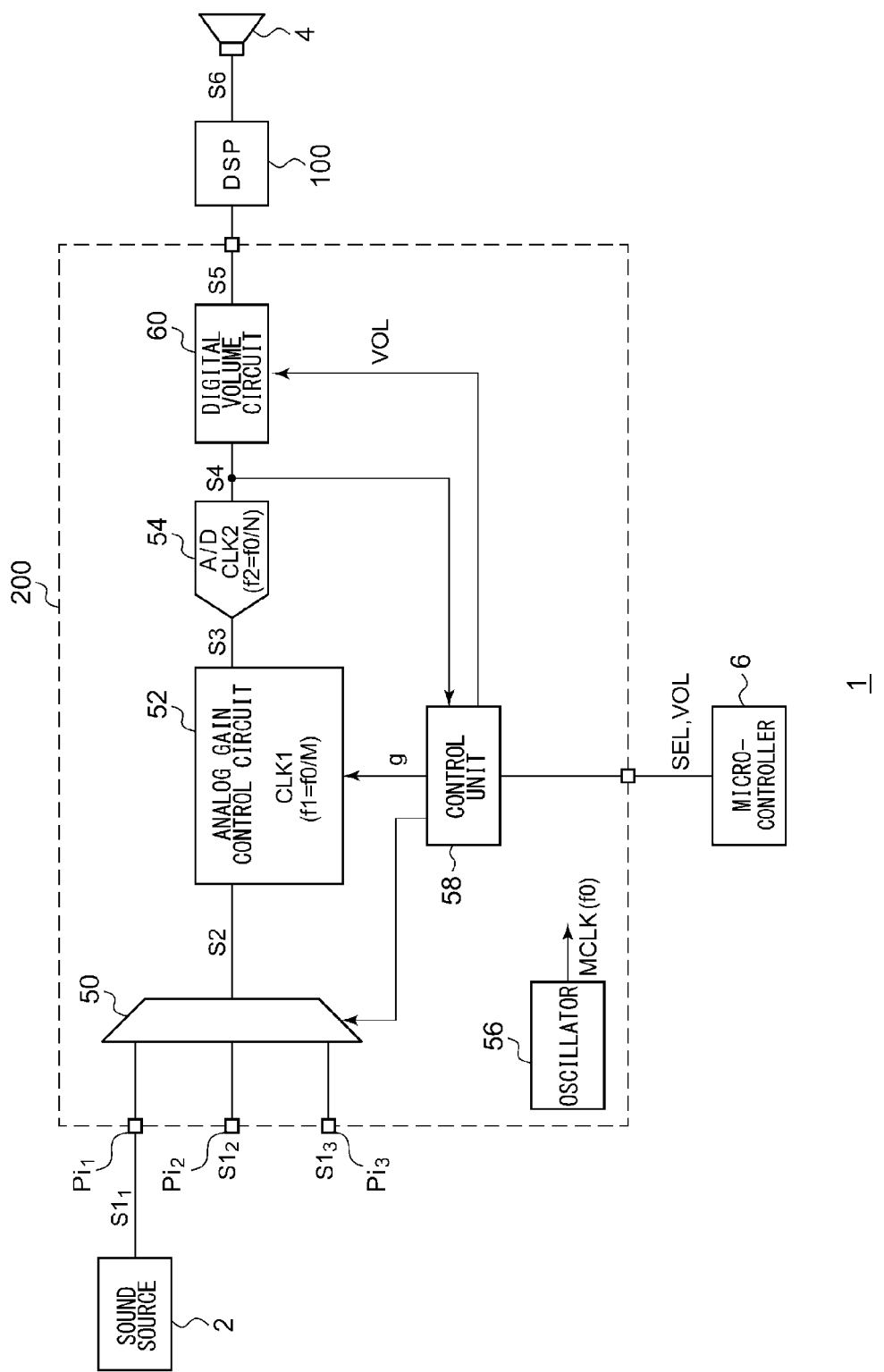
FIG. 2 is a block diagram which shows a configuration of an audio apparatus according to a first embodiment.

FIG. 2 is a block diagram which shows a configuration of an audio apparatus 1 according to a first embodiment. The audio apparatus 1 mainly includes a sound source 2, a first audio signal processing circuit 200, a second audio signal processing circuit 100, a speaker 4, and a microcontroller 6.

The sound source 2 is configured to output an analog audio signal S1. The sound source 2 is configured as a CD player, a DVD player, or a silicon audio player, having an analog output, for example. Otherwise, the sound source 2 is configured as a DSP configured to convert a digital audio signal into an analog audio signal.

The microcontroller 6 is a unit configured to integrally control the overall operation of the audio apparatus 1. The microcontroller 6 is configured to output volume data VOL set by the user to the first audio signal processing circuit 200.

The first audio signal processing circuit 200 includes three input ports $Pi_1$ through $Pi_3$. It should be noted that the first audio signal processing circuit 200 may include a desired number of input ports. The input ports $Pi_1$ through $Pi_3$ are configured to respectively receive analog audio signals $S1_1$ through $S1_3$ as input signals output from the respective sound sources 2 that are connected to the respective input ports $Pi_1$ through $Pi_3$.

The first audio signal processing circuit 200 includes a selector 50, an analog gain control circuit 52, an A/D converter 54, an oscillator 56, a control unit 58, and a digital volume circuit 60, which are monolithically integrated as a function IC on a single semiconductor substrate.

The selector 50 is configured to receive the analog audio signals $S1_1$ through $S1_3$ input to the multiple respective input ports $Pi_1$ through $Pi_3$. Furthermore, the microcontroller 6 is configured to receive, as an input signal, selection data SEL which indicates the input port $Pi_k$ (k=1, 2, 3) specified by the user. The selector 50 is controlled by the control unit 58 such that the selector 50 selects the analog audio signal $S1_k$ input to one particular input port $Pi_k$ specified by the user.

The analog gain control circuit 52 is configured to receive the analog audio signal S2 selected by the selector 50. The analog gain control circuit 52 is configured to amplify the analog audio signal S2 with a gain g set by the control unit 58. The gain g is set for each of the input ports $Pi_1$ through $Pi_3$. For example, the control unit 58 has a table which represents the relation between the input ports $Pi_1$ through $Pi_3$ and the gains $g_1$ through $g_3$ to be respectively set for the respective input ports $Pi_1$ through $Pi_3$. When the selection data SEL indicates the k-th input port $Pi_k$, the control unit 58 is configured to set the gain gk for the analog gain control circuit 52.

The analog gain control circuit 52 has a soft switching function, and is configured to gradually change the gain when the gain g is to be switched. The configuration of the analog gain control circuit 52 is not restricted in particular, and may be configured using known techniques.

The A/D converter 54 is configured to convert an output signal S3 of the analog gain control circuit 52 into a digital audio signal S4.

The digital volume circuit 60 includes a multiplier configured to multiply the digital audio signal S4 by a coefficient that corresponds to the volume value specified by the user. It should be noted that such a digital volume circuit 60 may be omitted.

A digital audio signal S5 subjected to volume control processing by the digital volume circuit 60 is output from the output port Po to the second audio signal processing circuit 100 configured as a downstream circuit. After the second audio signal processing circuit 100 performs various kinds of digital signal processing on the digital audio signal S5, the second audio signal processing circuit 100 converts the digital audio signal S5 thus processed into an analog audio signal S6. The analog audio signal S6 is input to the speaker 4, configured as a component downstream of the second audio signal processing circuit 100, via unshown amplifiers or filters. The speaker 4 may be configured as a different electroacoustic conversion element such as a headphone or the like.

The oscillator 56 is configured to generate a master clock signal MCLK having a predetermined frequency f0. The analog gain control circuit 52 is configured to generate a transition clock signal CLK1 having a first frequency f1 by dividing the master clock signal MCLK by a first frequency-dividing ratio 1/M. When the gain g is to be switched, the analog gain control circuit 52 is configured to switch the gain g from an initial value to a target value in a stepwise manner in synchronization with the transition clock signal CLK1.

The A/D converter 54 is configured to generate a conversion clock signal CLK2 having a predetermined sampling frequency f2 by dividing the master clock signal MCLK by a second frequency-dividing ratio 1/N. The A/D converter 54 is configured to convert the analog audio signal S3 into the digital audio signal S4 using the conversion clock signal CLK2.

That is to say, the analog gain control circuit 52 and the A/D converter 54 are configured to operate according to the clock signals CLK1 and CLK2 having an integer-multiple relation.

The above is the basic configuration of the first audio signal processing circuit 200.

In recent years, as the power consumption of the sound source 2, in particular, such as a portable audio player, connected to each input port $Pi_1$ through $Pi_3$ has become lower, in many cases, the amplitudes of the analog audio signals $S1_1$ through S13 input to the input ports $Pi_1$ through $Pi_3$ become smaller.

The first audio signal processing circuit 200 shown in FIG. 2 is capable of supplying, to the A/D converter 54, an analog audio signal S having an optimum signal level for the input range of the A/D converter 54. Thus, such an arrangement allows the A/D converter 54 to exhibit its maximum performance, thereby providing an improved S/N ratio.

Furthermore, by configuring the analog gain control circuit 52 and the A/D converter 54 as built-in components integrally formed as a single IC, and by operating the analog gain control circuit 52 and the A/D converter 54 in synchronization with the respective clock signals generated based on the master clock signal MCLK configured as a common clock signal, such an arrangement is capable of suppressing beat noise that occurs when the analog gain control circuit 52 and the A/D converter 54 operate asynchronously.

Next, description will be made regarding additional features of the first audio signal processing circuit 200.

When the digital audio signal S4 has a level that is lower than a predetermined threshold value TH, the gain g of the analog gain control circuit 52 is set to a minimum value that is substantially zero. This state will be referred to as the "mute state".

As described above, by setting the gain g of the analog gain control circuit 52 to substantially zero when the digital audio signal S4 has a level that is lower than the threshold level TH, i.e., in the no-signal state or the no-input state, such an arrangement provide a dramatically improved S/N ratio in the no-signal state or the no-input state.

Also, before the selector 50 switches the port, the control unit 58 may be configured to set the gain g of the analog gain control circuit 52 to the minimum value. Also, after the selector 50 completes switching the port, the control unit 58 may be configured to set the gain g of the analog gain control circuit 52 to a value that corresponds to the input port thus switched. Thus, such an arrangement is capable of suppressing noise that occurs when the selector 50 switches the port.

Also, when the digital audio signal S4 is clipped at a certain level in the unmuted state (normal state), the control unit 58 may be configured to reduce the gain g of the analog gain control circuit 52, thereby avoiding such a situation in which the digital audio signal S4 is clipped. Specifically, the control unit 58 is configured to monitor the level of the digital audio signal S4. When the level of the digital audio signal S4 continuously remains at its maximum value over a predetermined period of time, the control unit 58 judges that the digital audio signal S4 is in the clipped state, and reduces the gain g of the analog gain control circuit 52 by a predetermined value. Such a function will be referred to as "clipped state avoidance function".

By implementing such a clipped state avoidance function, such an arrangement allows the gains $g_1$ through $g_3$, which are to be respectively set for the input ports $Pi_1$ through $Pi_a$, to be set to higher values than with an arrangement that does not have such a clipped state avoidance function. Thus, when the input analog audio signal S1 has a small amplitude, an arrangement having such a clipped state avoidance function is capable of inputting, to the A/D converter 54 configured as a downstream circuit, the audio signal S2 having a greater amplitude than with an arrangement having no clipped state avoidance function. As a result, such an arrangement provides an improved S/N ratio when the audio signal is played back. Conversely, when the input analog audio signal S1 has a large amplitude at a certain level, such an arrangement is capable of suppressing signal distortion by means of the clipped state avoidance function.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

The transition time $\tau_T$ of the gain g is preferably set to be as short as possible. However, if the gain g is changed in a short period of time when the audio signal S1 has a low-frequency component as a dominant component, such an arrangement leads to the occurrence of audible noise. Conversely, when the audio signal S1 has a high-frequency component as a dominant component, such an arrangement rarely leads to the occurrence of audible noise even if the gain g is changed in a short period of time.

Thus, the control unit 58 may be configured to detect the frequency component included in the digital audio signal S4, and to shorten the transition time $\tau_T$ of the gain g of the analog gain control circuit 52 as the frequency component included in the digital audio signal S4 becomes higher. Thus, such an arrangement allows the transition time $\tau_T$ of the gain g to be optimized according to the frequency component of the audio signal S1.

Also, if the gain g is changed in a short period of time when the audio signal has a large amplitude, such an arrangement leads to the occurrence of audible noise. Conversely, when the audio signal has a small amplitude, such an arrangement rarely leads to the occurrence of audible noise even if the gain g is changed in a short period of time.

Thus, the control unit 58 may be configured to shorten the transition time $\tau_T$ of the gain g as the amplitude of the digital audio signal S4 becomes smaller. Thus, such an arrangement allows the transition time $\tau_T$ of the gain g to be optimized according to the amplitude of the audio signal S1.

It should be noted that, with the first embodiment, by using the analog gain control circuit 52 to boost a predetermined frequency component, and by using the digital volume circuit 60 to cut off a predetermined frequency component, such an arrangement provides further improved distortion characteristics.

[Second Embodiment]

Figure 3:
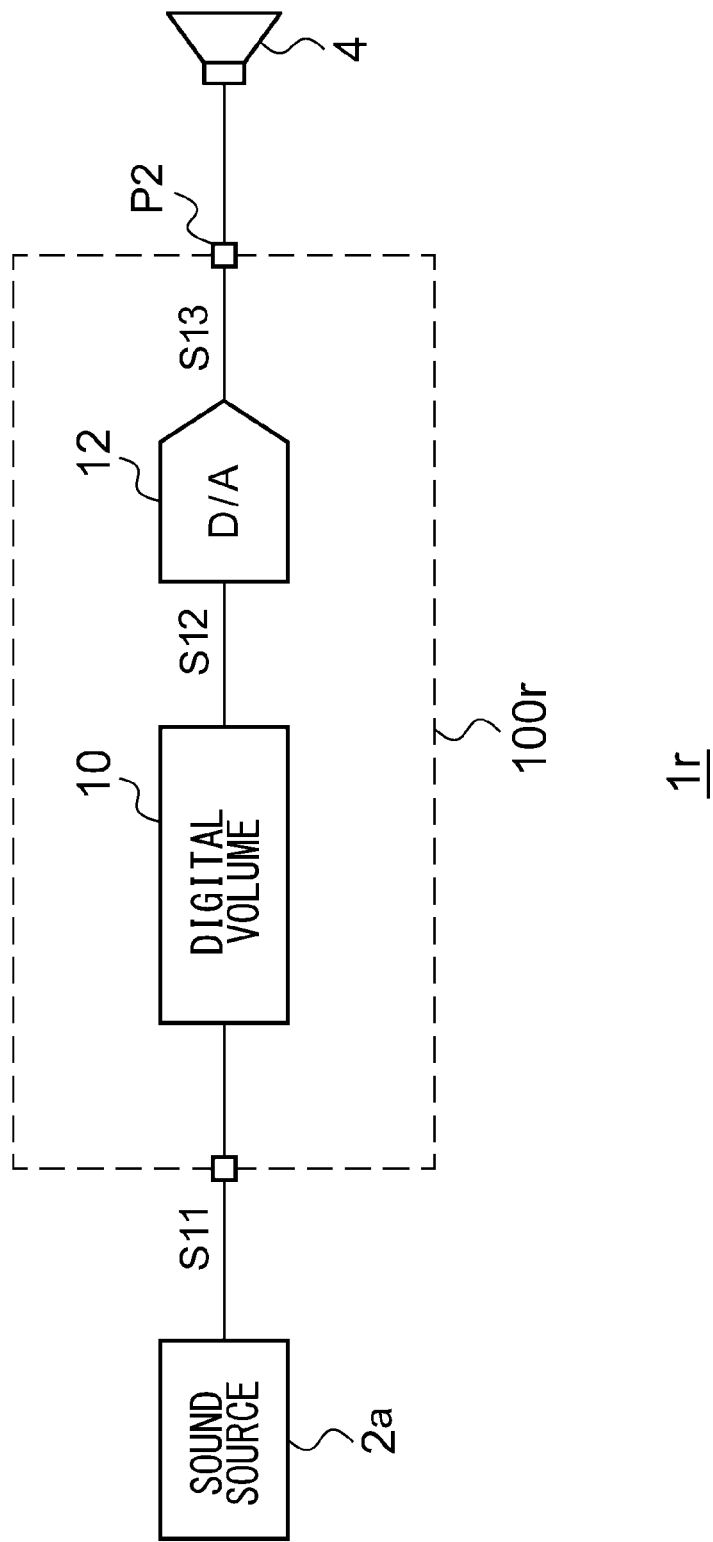
FIG. 3 is a block diagram which shows a configuration of an audio apparatus investigated by the present inventor.

FIG. 3 is a block diagram which shows a configuration of an audio apparatus investigated by the present inventor. An audio apparatus 1r includes a sound source 2, an electroacoustic conversion element such as a speaker or a headphone (which will collectively be referred to simply as the "speaker"

hereafter) 4, and an audio signal processing circuit 100r. The sound source 2 is configured to output a digital audio signal S1. The sound source 2 is configured as a CD player, a DVD player, or a silicon audio player, having a digital output, for example. Otherwise, the sound source 2 is configured as a DSP (Digital Signal Processor) configured to convert an analog audio signal into a digital audio signal. The audio signal processing circuit 100r includes a digital volume circuit 10 configured to receive a digital audio signal S1 from the sound source 2, and to change the amplitude level of the audio signal S1 thus received. The digital volume circuit 10 is configured as a multiplier configured to multiply the digital audio signal S1 by a coefficient that corresponds to the volume.

A D/A (Digital to Analog) converter 12 is configured to convert an audio signal S2 output from the digital volume circuit 10 into an analog audio signal S3. The audio signal S3 is input to the speaker 4 configured as a component downstream of the audio signal processing circuit 100r via unshown amplifiers or filters.

If the level of the audio signal Si is reduced by means of the digital volume circuit 10 when the audio signal S1 has a low level, D/A conversion involves only a small part of the input range of the D/A converter 12. Thus, the audio apparatus 1r shown in FIG. 3 has a problem of poor signal distortion characteristics when the audio signal S1 has a low signal level. Description will be made in the second embodiment regarding a technique for solving such a problem.

Figure 4:
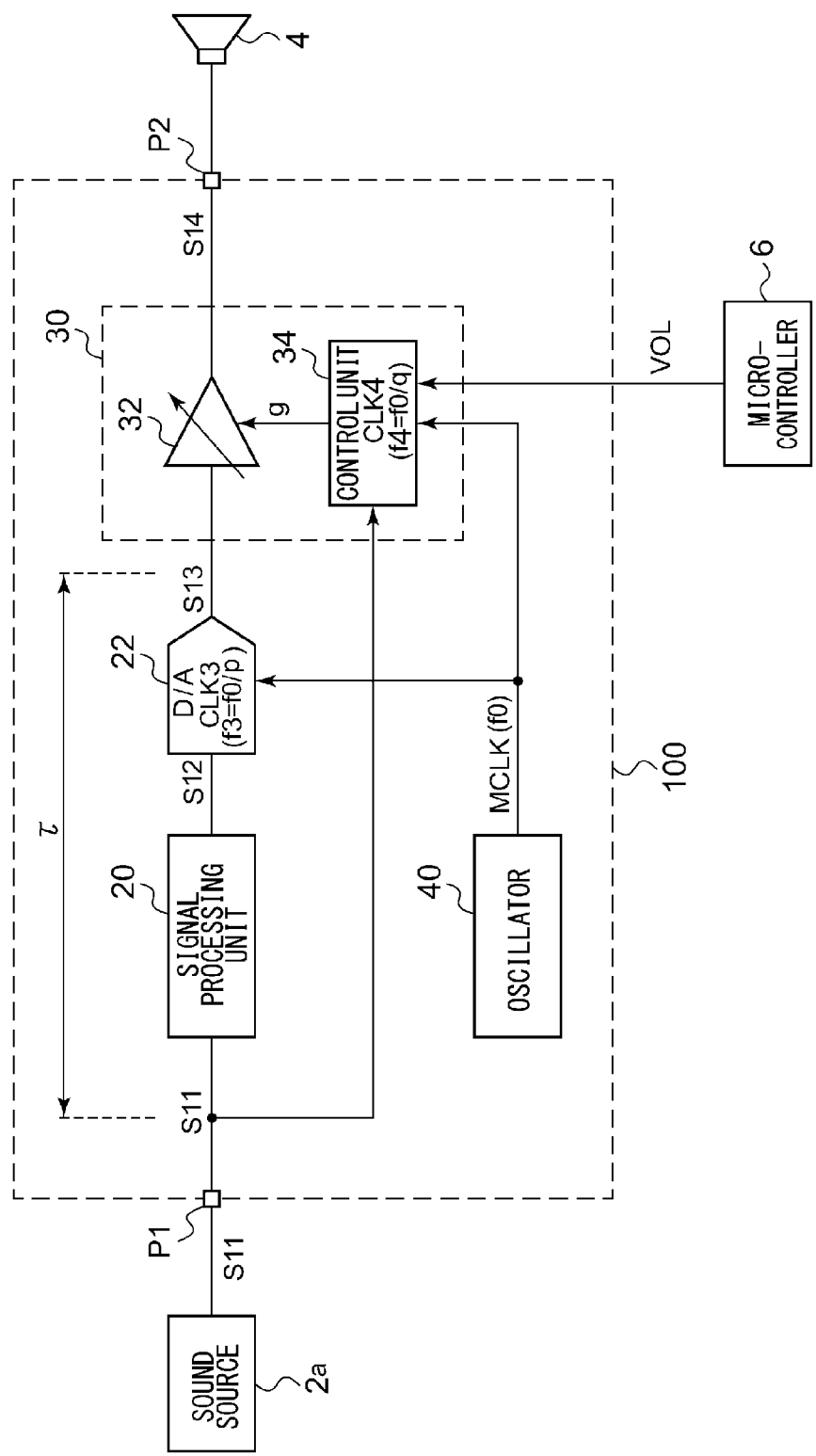
FIG. 4 is a block diagram which shows a configuration of an audio apparatus according to a second embodiment.

FIG. 4 is a block diagram which shows a configuration of an audio apparatus 1 according to a second embodiment. The audio apparatus 1 mainly includes a sound source 2, an audio signal processing circuit 100, a speaker 4, and a microcontroller 6.

The sound source 2 is configured to output a digital audio signal S1. The sound source 2 is configured as a CD player, a DVD player, or a silicon audio player, having a digital output, for example. Otherwise, the sound source 2 is configured as a DSP configured to convert an analog audio signal into a digital audio signal.

The microcontroller 6 is a unit configured to integrally control the overall operation of the audio apparatus 1. The microcontroller 6 is configured to output, to the audio signal processing circuit 100, volume data VOL which indicates the volume set by the user.

The audio signal S1 output from the sound source is input to the input terminal P1 of the audio signal processing circuit 100. The audio signal processing circuit 100 includes a signal processing unit 20, a D/A converter 22, an analog volume circuit 30, and an oscillator 40, and are integrated as a function IC on a single semiconductor substrate.

The signal processing unit 20 is configured to perform various kinds of processing such as equalizing processing, tone control processing, loudness control processing, etc., on the audio signal S1 input to the input terminal P1.

The D/A converter 22 is configured to convert the audio signal S2 output from the signal processing unit 20 into an analog audio signal S3.

The analog volume circuit 30 is configured to amplify the output signal S4 of the D/A converter with a gain g that corresponds to the volume data VOL.

The analog volume circuit 30 having a soft transition switching function includes an analog amplifier 32 and a gain control unit 34. The analog amplifier 32 is configured to amplify the signal S3 output from the D/A converter 22 with the gain g set by the gain control unit 34. For example, the gain g is set in a range between 0 and 1. The analog amplifier 32 is configured as an attenuator.

The gain control unit 34 is configured to receive the volume data VOL from the microcontroller 6, and to set the gain g for the analog amplifier 32 according to the value of the volume data VOL thus received. When the value of the volume data VOL is changed, the gain control unit 34 is configured to gradually change the gain of the analog amplifier 32 from the current value to a value that corresponds to the volume thus changed. The configuration of the analog volume circuit 30 is not restricted in particular, and may be configured using known techniques.

The analog audio signal S4 amplified by the analog volume circuit 30 is output via the output terminal P2, and is input to the speaker 4 configured as a component downstream of the audio signal processing circuit 100, via unshown amplifiers or filters.

The oscillator 40 is configured to generate a master clock signal MCLK having a predetermined frequency f0. The D/A converter 22 is configured to divide the master clock signal MCLK by a predetermined third frequency dividing ratio 1/p so as to generate a conversion clock signal CLK3 having the sampling frequency of the audio signal S2. The D/A converter 22 is configured to convert the audio signal S2 into the analog audio signal S3 using the conversion clock signal CLK3 thus generated.

The gain control unit 34 of the analog volume circuit 30 is configured to divide the master clock signal MCLK by a second frequency dividing ratio 1/q so as to generate a transition clock signal CLK4. The gain control unit 34 is configured to switch the gain g, which is to be set for the analog amplifier 32, in synchronization with the transition clock signal CLK4 such that it transits in a stepwise manner from the initial value to the target value.

As described above, the D/A converter 22 and the analog volume circuit 30 are each configured to operate according to the clock signals CLK3 and CLK4 having an integer-multiple relation.

The above is the basic configuration of the audio signal processing circuit 100. With the audio signal processing circuit 100, by providing the analog volume circuit 30 as a component downstream of the D/A converter 22, such an arrangement is capable of effectively using the input range of the D/A converter 22. Thus, such an arrangement is capable of preventing distortion characteristics from degrading due to the volume control operation even if the audio signal S1 has a low level.

It is needless to say that the analog volume circuit 30 has a soft transition switching function, thereby suppressing noise occurring due to switching of the volume value.

Furthermore, by integrating the D/A converter 22 and the analog volume circuit 30 as built-in components in a single IC (Integrated Circuit), and by operating the D/A converter 22 and the analog volume circuit 30 in synchronization with the respective clock signals generated based on the common master clock signal MCLK, such an arrangement is capable of reducing beat noise that occurs in a state in which the D/A converter 22 and the analog volume circuit 30 operate asynchronously.

Next, description will be made regarding additional features of the audio signal processing circuit 100.

The gain control unit 34 of the analog volume circuit 30 is configured to monitor the level of the digital audio signal S1. When the audio signal S1 has a level that is lower than a predetermined threshold value, the gain control unit 34 is configured to judge that the state is the no-input state or the no-signal state, and to set the gain g of the analog amplifier 32 to its minimum value which is a substantially zero. This state will be referred to as the "mute state".

Conversely, when the level of the digital audio signal S1 transits from a level that is lower than the predetermined threshold value to a level that is higher than the predetermined threshold value, the gain control unit 34 is configured to cancel the mute state, and to restore the gain g of the analog amplifier 32 to a value that corresponds to the volume set by the user.

The digital audio signal S1 requires a predetermined delay time $\tau_D$ to reach the analog volume circuit 30 after it is input to the audio signal processing circuit 100. The delay time $\tau_D$ may be configured as the delay time provided by an IIR (Infinite Impulse Response) filter included as a built-in component of the signal processing unit 20. Otherwise, the signal processing unit 20 may include a buffer configured to generate a desired delay.

The gain control unit 34 is configured to switch the gain g of the analog amplifier 32 such that it transits from the minimum value to a value that corresponds to the volume data VOL in a transition time $\tau_T$ that is shorter than the delay time $\tau_D$ required for the input signal to reach the analog volume circuit 30 from the input terminal P1.

Figure 5:
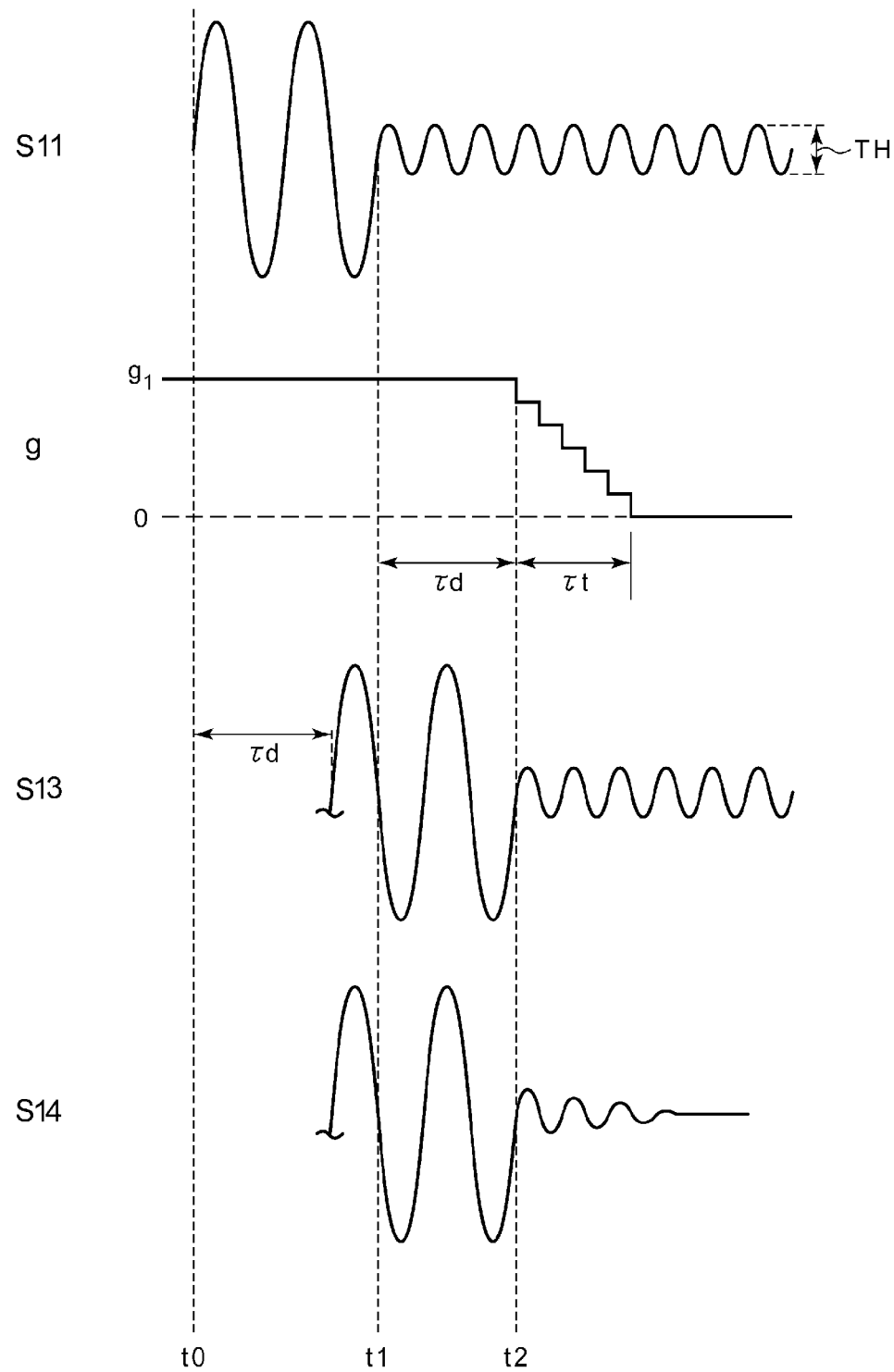
FIG. 5 is a waveform diagram which shows a mute operation of the audio signal processing circuit shown in FIG. 4.

FIG. 5 is a waveform diagram which shows the mute operation of the audio signal processing circuit 100 shown in FIG. 4. It should be noted that the vertical axis and the horizontal axis shown in the waveform diagram are expanded or reduced as appropriate for ease of understanding. Also, each waveform shown in the drawing is simplified for ease of understanding.

During a period from the time point t0 to the time point t1, the audio signal S1 has an amplitude at a certain level. At the time point t1, the amplitude (signal level) of the audio signal S1 becomes lower than the threshold value TH.

After the delay time $\tau_D$ elapses immediately after the gain control unit 34 detects the no-signal state at the time point t1, the gain control unit 34 gradually reduces the gain g of the gain control unit 34 in a stepwise manner from the value $g_1$ that corresponds to the volume data VOL toward the minimum value 0.

After the time point t2, the audio signal S3 is amplified with the gain g which is substantially zero. Accordingly, the audio signal S4 has an extremely low signal level. As described above, by reducing the gain of the analog amplifier 32 to substantially zero in the no-signal state or the no-input state, such an arrangement is capable of dramatically improving the S/N ratio in the no-signal state or the no-input state.

Figure 6:
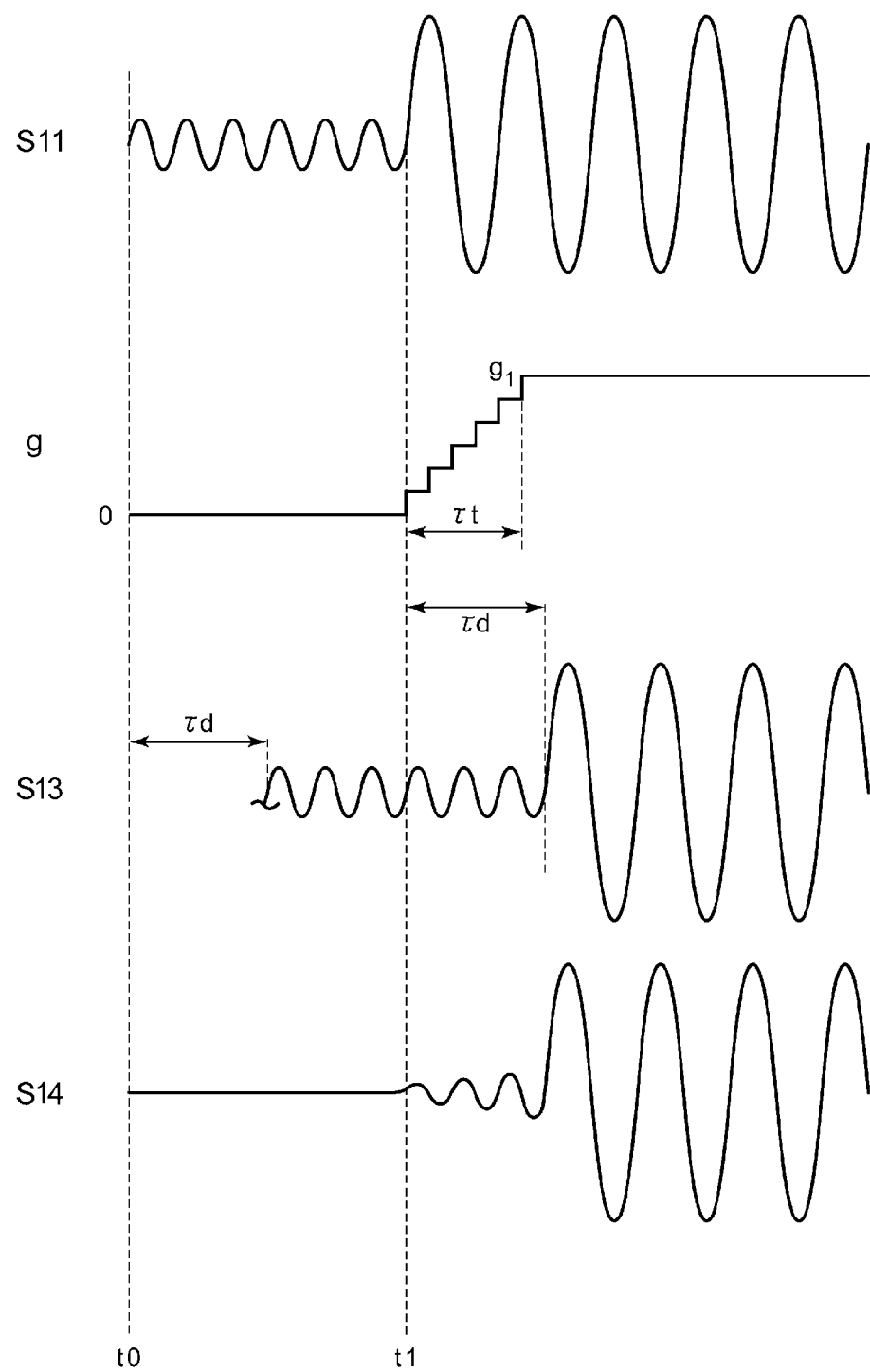
FIG. 6 is a waveform diagram which shows an operation of the audio signal processing circuit shown in FIG. 4 in which the state is returned from the mute state to a signal output state.

FIG. 6 is a waveform diagram which shows the operation of the audio signal processing circuit 100 shown in FIG. 4 in which the state is returned from the mute state to the signal output state. During a period of time from the time point t0 to the time point t1, the audio signal S1 has a level that is lower than the threshold value TH. When the level of the audio signal S1 becomes greater than the threshold value TH at the time point t1, the gain control unit 34 immediately judges that the state has switched to the signal output state. Subsequently, the gain control unit 34 gradually raises the gain g of the analog amplifier 32 in a stepwise manner from a value which is substantially zero toward the value $g_1$ that corresponds to the volume data VOL. The transition time $\tau_T$ required for the gain g to be restored from zero to $g_1$ is set to be shorter than the delay time $\tau_D$ required for the input signal to reach the analog amplifier 32 from the input terminal P1.

If the transition time $\tau_T$ is longer than the delay time $\tau_D$, the volume changes while the audio signal S3 is being played back, which is uncomfortable. In contrast, with the audio signal processing circuit 100, when the state transits from the no-input state or no-signal state to the signal output state, the volume control is completed before the audio signal S3 reaches the analog volume circuit 30. Thus, such an arrangement is capable of preventing the volume from changing while the audio signal is being played back.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

The transition time $\tau_T$ of volume is preferably set to be as short as possible. However, if the volume is changed in a short period of time when the audio signal S1 has a low-frequency component as a dominant component, such an arrangement leads to the occurrence of audible noise. Conversely, when the audio signal S1 has a high-frequency component as a dominant component, such an arrangement rarely leads to the occurrence of audible noise even if the volume is changed in a short period of time.

Thus, the gain control unit 34 of the analog volume circuit 30 may be configured to detect the frequency component included in the digital audio signal S1, and to shorten the transition time $\tau_T$ of the gain as the frequency component included in the digital audio signal S1 becomes higher. Thus, such an arrangement allows the transition time $\tau_T$ of the volume to be optimized according to the frequency component of the audio signal S1.

Also, if the volume is changed in a short period of time when the audio signal has a large amplitude, such an arrangement leads to the occurrence of audible noise. Conversely, when the audio signal has a small amplitude, such an arrangement rarely leads to the occurrence of audible noise even if the volume is changed in a short period of time.

Thus, the gain control unit 34 of the analog volume circuit 30 may be configured to shorten the transition time $\tau_T$ of the gain g as the amplitude of the digital audio signal S1 becomes smaller. Thus, such an arrangement allows the transition time of the volume to be optimized according to the amplitude of the audio signal.

It should be noted that, with the second embodiment, by using the signal processing unit 20 to boost a predetermined frequency component, and by using the analog amplifier 32 to cut off a predetermined frequency component, such an arrangement provides further improved distortion characteristics.

[Third Embodiment]

Figure 7:
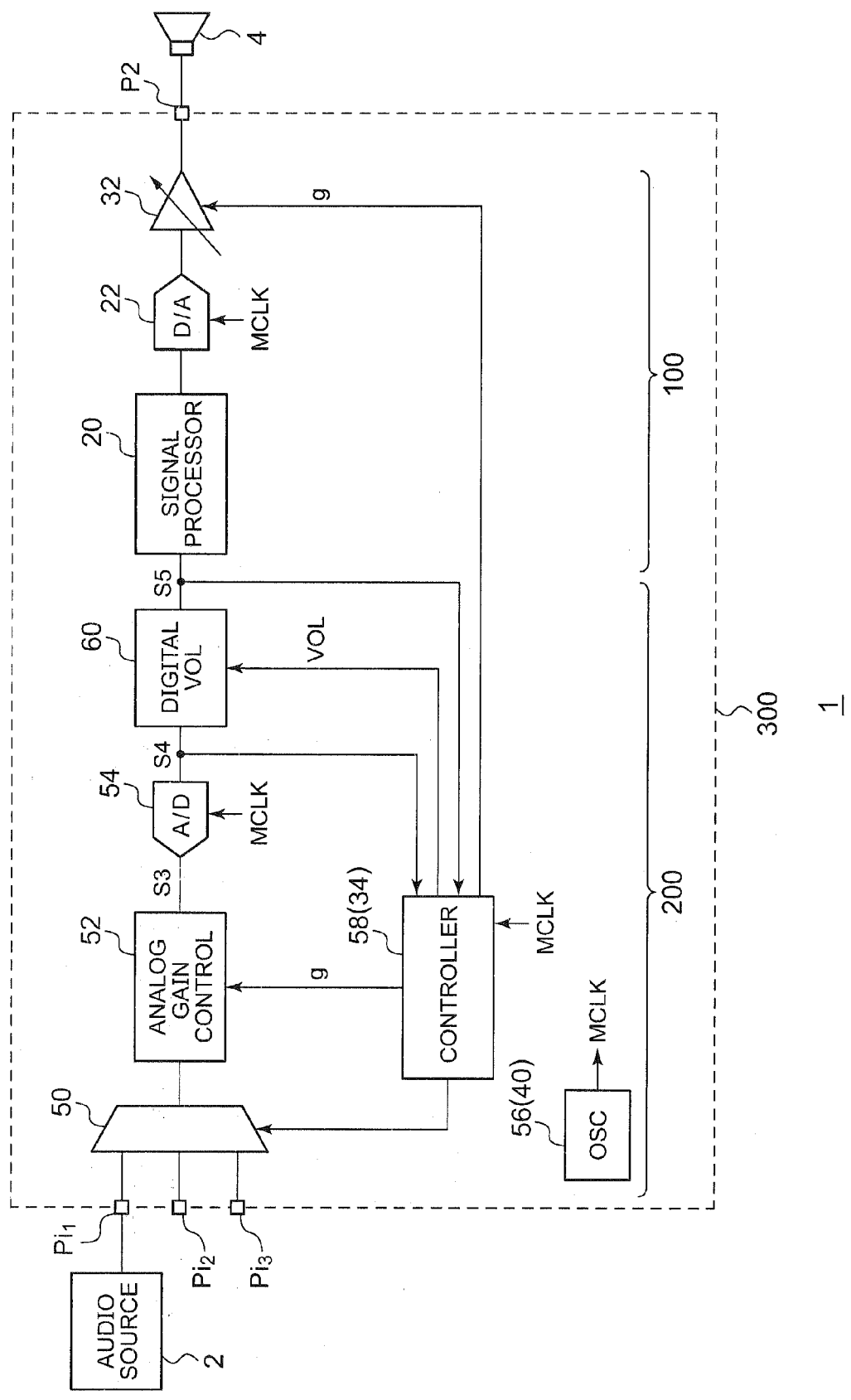
FIG. 7 is a block diagram which shows a configuration of an audio apparatus according to a third embodiment.

A third embodiment relates to a combination of the second audio signal processing circuits 100 and 200 according to the first and second embodiments. FIG. 7 is a block diagram which shows a configuration of an audio signal processing circuit according to the third embodiment. The audio signal processing circuit 300 shown in FIG. 7 is configured to receive data from an unshown microcontroller in the same way as in the aforementioned embodiments.

The audio signal processing circuit 300 includes a selector 50, an analog gain control circuit 52, an A/D converter 54, an oscillator 56, a control unit 58, a signal processing unit 20, a D/A converter 22, and an analog amplifier 32, which are integrated on a single semiconductor substrate. The configuration and the operation of each block are the same as described above.

Such an audio signal processing circuit also provides the same advantages as described above by means of the second audio signal processing circuit 100 and the first audio signal processing circuit 200.

By using the signal processing unit 20 and the analog gain control circuit 52 to boost a predetermined frequency component, and by using the analog amplifier 32 to cut off (attenuate) a predetermined frequency component, such an arrangement provides further improved distortion characteristics.

While the preferred embodiments of the present invention have been described using specific terms, such description is for illustrative purposes only, and it is to be understood that changes and variations may be made without departing from the spirit or scope of the appended claims.

What is claimed is:

1. An audio signal processing circuit comprising:
    a selector having a plurality of input ports that receive respective analog audio signals, and configured to select an analog audio signal at one of the plurality of input ports;
    an oscillator configured to generate a master clock signal;
    an analog gain control circuit configured to amplify the analog audio signal received from the selector with a gain set for each input port, wherein the analog gain control circuit frequency-divides the master clock signal with a first frequency-dividing ratio so as to generate a first transition clock signal and gradually changes the gain when the gain is switched in synchronization with the first transition clock signal; and
    an A/D converter configured to frequency-divide the master clock signal with a second frequency-dividing ratio so as to generate a first conversion clock signal and to convert an output signal of the analog gain control circuit into a first digital audio signal using the first conversion clock signal,
    wherein the audio signal processing circuit is monolithically integrated on a single semiconductor substrate; and
    wherein the first frequency-dividing ratio is different from the second frequency-dividing ratio, thereby reducing beat noise.

2. The audio signal processing circuit according to claim 1, wherein, when the first digital audio signal has a level that is lower than a predetermined threshold, the gain of the analog gain control circuit is set to a minimum value.

3. The audio signal processing circuit according to claim 1, wherein, before a switching operation of the selector, the gain of the analog gain control circuit is set to a minimum value,
    and wherein, after the switching operation of the selector is completed, the gain of the analog gain control circuit is set to a value that corresponds to said one of the plurality of input ports.

4. The audio signal processing circuit according to claim 1, wherein, when a level of the first digital audio signal is clipped, the gain of the analog gain control circuit is reduced.

5. The audio signal processing circuit according to claim 1, wherein a frequency component included in the first digital audio signal is detected,
    and wherein a transition time of the gain of the analog gain control circuit is reduced as a the frequency component included in the first digital audio signal becomes higher.

6. The audio signal processing circuit according to claim 1, wherein a transition time of the gain of the analog gain control circuit is reduced as an amplitude of the first digital audio signal becomes lower.

7. The audio signal processing circuit according to claim 1, further comprising:
    a D/A converter configured to receive a second digital audio signal, to frequency-divide the master clock signal with a third frequency-dividing ratio so as to generate a second conversion clock signal, and to convert the second digital audio signal into second analog audio signal using the second conversion clock signal; and
    an analog volume circuit configured to receive the second analog audio signal from the D/A converter and to amplify the second analog audio signal with a gain that corresponds to a volume value, wherein the analog volume circuit frequency-divides the master clock signal with a fourth frequency-dividing ratio so as to generate a second transition clock signal and gradually changes the gain when the volume value is switched in synchronization with the second transition clock signal,
    wherein the D/A converter and the analog volume circuit are monolithically integrated on the single semiconductor substrate.

8. The audio signal processing circuit according to claim 7, wherein, when the second digital audio signal has a level that is lower than a predetermined threshold value, the gain of the analog volume circuit is set to a minimum value.

9. The audio signal processing circuit according to claim 8, wherein the second digital audio signal requires a predetermined delay time to reach the analog volume circuit after it is input to the audio signal processing circuit,
    and wherein, when the level of the second digital audio signal transits from a level that is lower than a predetermined threshold value to a level that is higher than a predetermined threshold value, the analog volume circuit is configured to change the gain of the analog volume circuit from a minimum value to a value that corresponds to the volume value in a transition time that is shorter than the predetermined delay time.

10. The audio signal processing circuit according to claim 7, wherein the analog volume circuit is configured to detect a frequency component included in the second digital audio signal,
    and wherein the analog volume circuit is configured to shorten a transition time of the gain as the frequency component included in the second digital audio signal becomes higher.

11. The audio signal processing circuit according to claim 7, wherein the analog volume circuit is configured to shorten a transition time of the gain as an amplitude of the second digital audio signal becomes lower.

12. An audio apparatus comprising the audio signal processing circuit according to claim 1.

13. An audio signal processing circuit comprising:
    an oscillator configured to generate a master clock signal;
    a D/A converter configured to receive a second digital audio signal, to frequency-divide the master clock signal with a third frequency-dividing ratio so as to generate a second conversion clock signal, and to convert the second digital audio signal into a second analog audio signal using the second conversion clock signal; and
    an analog volume circuit configured to receive the second analog audio signal from the D/A converter and to amplify the second analog audio signal with a gain that corresponds to a volume value, wherein the analog volume circuit frequency-divides the master clock signal with a fourth frequency-dividing ratio so as to generate a second transition clock signal and gradually changes the gain when the volume value is switched in synchronization with the second transition clock signal,
    wherein the audio signal processing circuit is monolithically integrated on a single semiconductor substrate; and
    wherein the third frequency-dividing ratio is different from the fourth frequency-dividing ratio, thereby reducing beat noise.

14. The audio signal processing circuit according to claim 13, wherein, when the second digital audio signal has a level that is lower than a predetermined threshold value, the gain of the analog volume circuit is set to a minimum value.

15. The audio signal processing circuit according to claim 14, wherein the second digital audio signal requires a predetermined delay time to reach the analog volume circuit after it is input to the audio signal processing circuit, and wherein, when a level of the second digital audio signal transits from a level that is lower than a predetermined threshold value to a level that is higher than a predetermined threshold value, the analog volume circuit is configured to change the gain of the analog volume circuit from a minimum value to a value that corresponds to a volume value set in a transition time that is shorter than the predetermined delay time.

16. The audio signal processing circuit according to claim 13, wherein the analog volume circuit is configured to detect a frequency component included in the second digital audio signal, and wherein the analog volume circuit is configured to shorten a transition time of the gain as the frequency component included in the second digital audio signal becomes higher.

* * * * *